(12) United States Patent
Ueki (10) Patent No.: US 10,804,258 B2
(45) Date of Patent: Oct. 13, 2020

(54) ESD PROTECTION DEVICE AND SIGNAL TRANSMISSION LINE

(71) Applicant: Murata Manufacturing Co., Ltd., Nagaokakyo-shi, Kyoto-fu (JP)

(72) Inventor: Noriyuki Ueki, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 253 days.

(21) Appl. No.: 16/161,248

(22) Filed: Oct. 16, 2018

(65) Prior Publication Data

US 2019/0051644 A1    Feb. 14, 2019

Related U.S. Application Data

(63) Continuation of application No. PCT/JP2018/021243, filed on Jun. 1, 2018.

(30) Foreign Application Priority Data

Aug. 10, 2017  (JP) ................... 2017-155119

(51) Int. Cl.
*H01L 27/02* (2006.01)
*H01L 27/06* (2006.01)
(Continued)

(52) U.S. Cl.
CPC ...... *H01L 27/0248* (2013.01); *H01L 27/0676* (2013.01); *H01L 27/0814* (2013.01); *H02H 9/04* (2013.01)

(58) Field of Classification Search
CPC ............. H01L 27/0248; H01L 27/0676; H01L 27/0814; H02H 9/04
See application file for complete search history.

(56) References Cited

U.S. PATENT DOCUMENTS 6,188,109 B1 *  2/2001  Takahashi ............... H01L 22/34
                                                           257/153
6,426,531 B1 *  7/2002  Kinugasa ............... H01L 22/32
                                                           257/355
(Continued)

FOREIGN PATENT DOCUMENTS

JP    H05160265 A    6/1993
JP    H06151717 A    5/1994
(Continued)

OTHER PUBLICATIONS

International Search Report issued in PCT/JP2018/021243, dated Jun. 26, 2018.
(Continued)

*Primary Examiner* — Yusef A Ahmed
(74) *Attorney, Agent, or Firm* — Arent Fox LLP (57) ABSTRACT

An ESD protection device that includes a semiconductor substrate that has a first main surface, terminal electrodes formed on the first main surface, a terminal electrode that is connected to the ground, and a wiring electrode that connects the terminal electrodes to each other and that forms a part of a main line. Moreover, the semiconductor substrate has a rectangular cuboid shape in a plan view and further includes a first semiconductor region that is connected to the wiring electrode, a second semiconductor region that is connected to the third terminal electrode, and a third semiconductor region. The first semiconductor region and the second semiconductor region are arranged along short sides of the semiconductor substrate and electrically connected to each other with the third semiconductor region that extends along the short sides interposed therebetween.

20 Claims, 4 Drawing Sheets

(51) Int. Cl.
*H01L 27/08* (2006.01)
*H02H 9/04* (2006.01)

(56) References Cited

U.S. PATENT DOCUMENTS

| | | | | |
|---|---|---|---|---|
| 9,911,730 | B2* | 3/2018 | Yao | H01L 27/0255 |
| 10,043,786 | B2* | 8/2018 | Sakai | H01L 29/866 |
| 2013/0099353 | A1* | 4/2013 | Kato | H01L 27/0296 |
| | | | | 257/531 |
| 2013/0168837 | A1* | 7/2013 | Kato | H01L 23/60 |
| | | | | 257/659 |
| 2014/0070367 | A1* | 3/2014 | Kawase | H01L 29/66106 |
| | | | | 257/532 |
| 2015/0243612 | A1* | 8/2015 | Yamamoto | H01L 21/78 |
| | | | | 257/693 |
| 2015/0364461 | A1* | 12/2015 | Kato | H01L 27/0814 |
| | | | | 257/499 |
| 2015/0364462 | A1* | 12/2015 | Nakaiso | H01L 27/0292 |
| | | | | 257/751 |
| 2015/0371941 | A1* | 12/2015 | Nakaiso | H01L 23/528 |
| | | | | 257/499 |
| 2015/0371984 | A1* | 12/2015 | Kato | H01L 24/06 |
| | | | | 257/491 |
| 2017/0148707 | A1* | 5/2017 | Nakaiso | H01L 23/53247 |
| 2017/0229445 | A1* | 8/2017 | Maehara | H01L 27/0629 |
| 2017/0373492 | A1* | 12/2017 | Ueki | H01L 27/0288 |
| 2018/0342575 | A1* | 11/2018 | Tanaka | H01L 29/78696 |
| 2019/0043984 | A1* | 2/2019 | Shiraishi | H03K 17/08142 |
| 2019/0051645 | A1* | 2/2019 | Sasaki | H01L 27/0255 |
| 2019/0123040 | A1* | 4/2019 | Fukahori | H01L 21/3205 |
| 2019/0123553 | A1* | 4/2019 | Ueki | H03H 7/0107 |
| 2019/0214815 | A1* | 7/2019 | Fukahori | H01L 28/40 |
| 2019/0319025 | A1* | 10/2019 | Ueki | H01F 27/29 |

FOREIGN PATENT DOCUMENTS

| | | |
|---|---|---|
| JP | 2000340745 A | 12/2000 |
| JP | 2001327069 A | 11/2001 |
| JP | 2003229428 A | 8/2003 |
| JP | 2013065771 A | 4/2013 |
| JP | 2016032043 A | 3/2016 |

OTHER PUBLICATIONS

Written Opinion of the International Searching Authority issued in PCT/JP2018/021243, dated Jun. 26, 2018.

* cited by examiner

ESD PROTECTION DEVICE AND SIGNAL TRANSMISSION LINE

CROSS REFERENCE TO RELATED APPLICATIONS

The present application is a continuation of PCT/JP2018/021243 filed Jun. 1, 2018, which claims priority to Japanese Patent Application No. 2017-155119, filed Aug. 10, 2017, the entire contents of each of which are incorporated herein by reference.

TECHNICAL FIELD

The present disclosure relates to an ESD protection device that uses a semiconductor and that guides, for example, a surge to the ground while allowing a desired signal to pass therethrough.

BACKGROUND

ESD protection elements, or ESD protection circuits, have been put to practical use to protect an electronic component from a surge such as an electrostatic discharge.

For example, Patent Document 1 (identified below) discloses an ESD protection circuit with a zener diode. The zener diode disclosed in Patent Document 1 includes two terminals one of which is connected to a signal line and the other of which is connected to the ground.

Such a zener diode typically includes a housing in the form of a rectangular cuboid. A TVS element that uses a PN junction of a semiconductor, that is, a diode is formed in the housing. Outer connection electrodes that serve as the one terminal and the other terminal are formed at both ends of the housing. That is, the zener diode is formed of a two-terminal chip component.

Patent Document 1: Japanese Unexamined Patent Application Publication No. 2001-327069.

In the zener diode that is formed of the two-terminal chip component, however, the ESL (equivalent series inductance) of the TVS element is connected in series with the ESL of wiring lines that connect the TVS element to the respective outer connection electrodes.

Accordingly, the ESL of the zener diode increases. This impairs ESD protection performance and degrades transmission characteristics of a desired signal.

SUMMARY OF THE INVENTION

In view of the foregoing, it is an object of the present disclosure to provide an ESD protection device that has a low ESL.

Thus, an ESD protection device according to an exemplary embodiment includes a semiconductor substrate that has a first main surface, a first terminal electrode and a second terminal electrode that are formed on a first main surface side of the semiconductor substrate, a third terminal electrode that is connected to a ground, and a wiring electrode that is formed on the first main surface side of the semiconductor substrate, that connects the first terminal electrode and the second terminal electrode to each other, and that forms a part of a main line. Moreover, the semiconductor substrate has a rectangular cuboid shape in a plan view and has long sides that extend in a first direction perpendicular to a thickness direction of the semiconductor substrate and short sides that extend in a second direction perpendicular to the thickness direction and the first direction. The wiring electrode and the third terminal electrode are connected to each other with the semiconductor substrate interposed therebetween. The semiconductor substrate has a first semiconductor region that is connected to the wiring electrode, a second semiconductor region that is connected to the third terminal electrode, and a third semiconductor region. The first semiconductor region and the second semiconductor region are arranged in the second direction and electrically connected to each other with the third semiconductor region that extends in the second direction interposed therebetween, and electric current that flows from the wiring electrode to the third terminal electrode flows in the second direction of the semiconductor substrate in a plan view.

With this structure, a current path in the semiconductor substrate that connects the wiring electrode and the third terminal electrode to each other decreases, and ESL can be decreased. In addition, the sectional area of the current path increases, and resistance can be decreased.

The ESD protection device according to the exemplary embodiment preferably includes a first pad electrode that is formed on the first main surface of the semiconductor substrate and that is connected to the wiring electrode, and a second pad electrode that is formed on the first main surface of the semiconductor substrate and that is connected to the third terminal electrode. Moreover, the first pad electrode has a first portion via which electric current flows into the semiconductor substrate from the first pad electrode, the second pad electrode has a second portion via which the electric current in the semiconductor substrate flows from the second pad electrode, and the first portion and the second portion are parallel to the second direction.

This structure is simple and enables the current path to be short.

Moreover, in an exemplary aspect, the ESD protection device preferably further includes a re-wiring layer that is formed on the first main surface and contains the wiring electrode. The first terminal electrode, the second terminal electrode, and the third terminal electrode are outer electrodes that are exposed to an outside. The wiring electrode and the first pad electrode at least partly overlap in a plan view. The third terminal electrode and the second pad electrode at least partly overlap in a plan view.

With this structure, the wiring electrode and the first pad electrode can be connected to each other at the minimum distance, and the third terminal electrode and the second pad electrode can be connected to each other at the minimum distance.

In an ESD protection device according to the present disclosure, the third terminal electrode is disposed between the first terminal electrode and the second terminal electrode in the first direction.

With this structure, the distance between the wiring electrode and the third terminal electrode can be decreased, and accordingly, ESD protection performance can be inhibited from being impaired.

In an ESD protection device according to the present disclosure, the wiring electrode extends linearly in the first direction.

With this structure, the length of the wiring electrode can be decreased. Accordingly, wiring resistance decreases, and a loss can be reduced.

A signal transmission line according to the present disclosure includes a first ESD protection element and a second ESD protection element, a first line electrode, a second line electrode, and a ground electrode for grounding. The first ESD protection element and the second ESD protection element each have the same structure as any one of the above ESD protection devices. The first line electrode is divided into first divided sections in a transmission direction, and the divided sections are connected to each other by the first terminal electrode and the second terminal electrode of the first ESD protection element. Moreover, the second line electrode is divided into second divided sections in the transmission direction, and the divided sections are connected to each other by the first terminal electrode and the second terminal electrode of the second ESD protection element. An auxiliary ground electrode that is connected to the ground electrode for grounding is disposed between the divided sections. The third terminal electrode of the first ESD protection element and the third terminal electrode of the second ESD protection element are connected to the auxiliary ground electrode.

With this structure, a parasitic inductance between the first line electrode and the second line electrode decreases.

According to the present disclosure, an ESD protection device having a low ESL is provided, an ESD protection device having a low ESR is provided, and the ESD protection performance can be inhibited from being impaired.

DETAILED DESCRIPTION

Figure 1A:
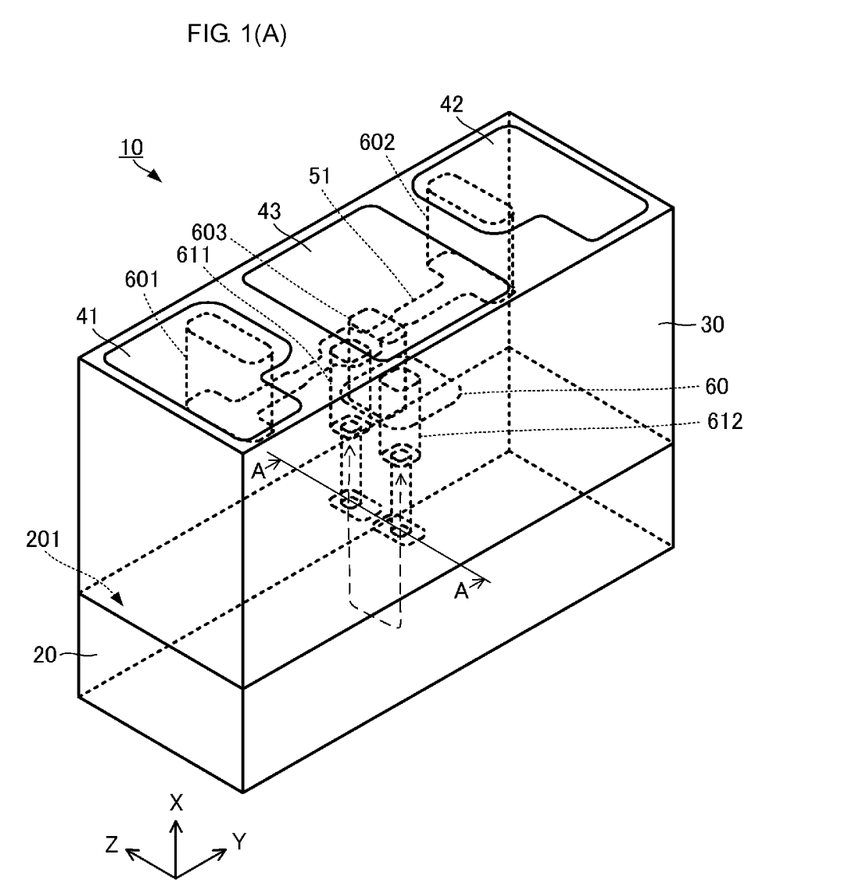
FIG. 1(A) is a perspective view of the appearance of an ESD protection device 10 according to an exemplary embodiment.
Figure 1B:
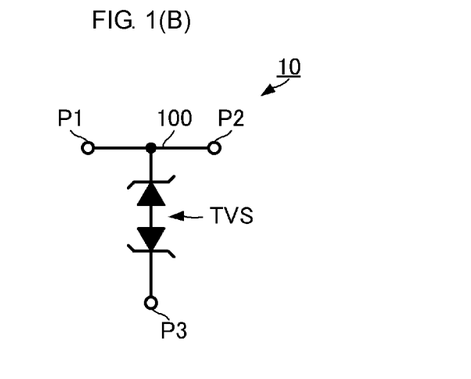
FIG. 1(B) is an equivalent circuit diagram of the ESD protection device 10 according to the exemplary embodiment.
Figure 2A:
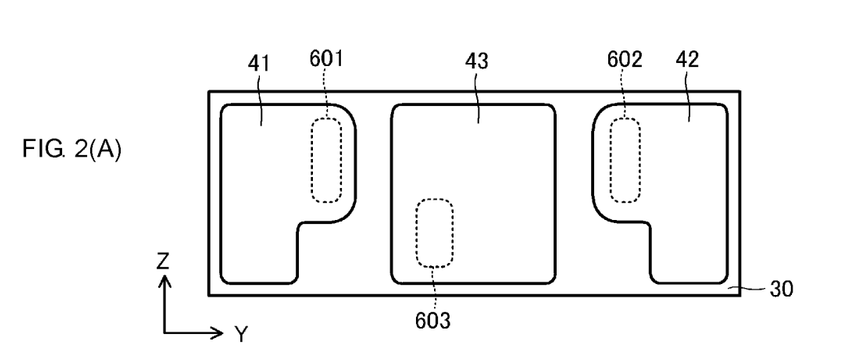
FIG. 2(A) is a plan view of a mounting surface of the ESD protection device 10 according to the exemplary embodiment.
Figure 2B:
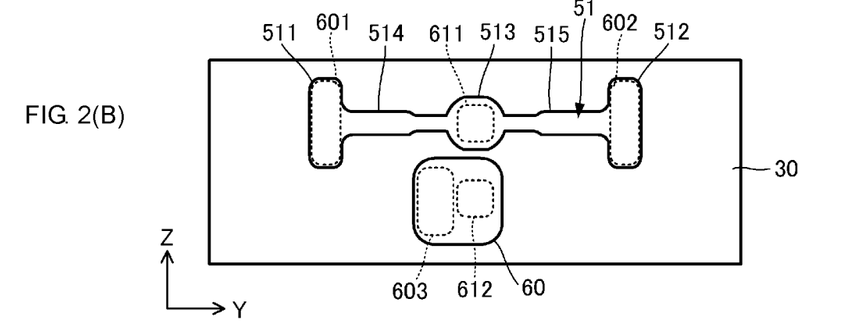
FIG. 2(B) is a plan view of a main wiring surface of the ESD protection device 10 according to the exemplary embodiment.
Figure 2C:
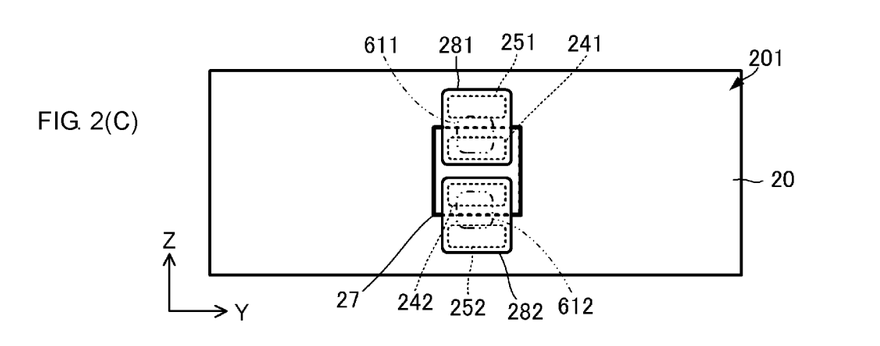
FIG. 2(C) is a plan view of a first main surface 201 of a semiconductor substrate 20 of the ESD protection device 10 according to the exemplary embodiment.
Figure 3A:
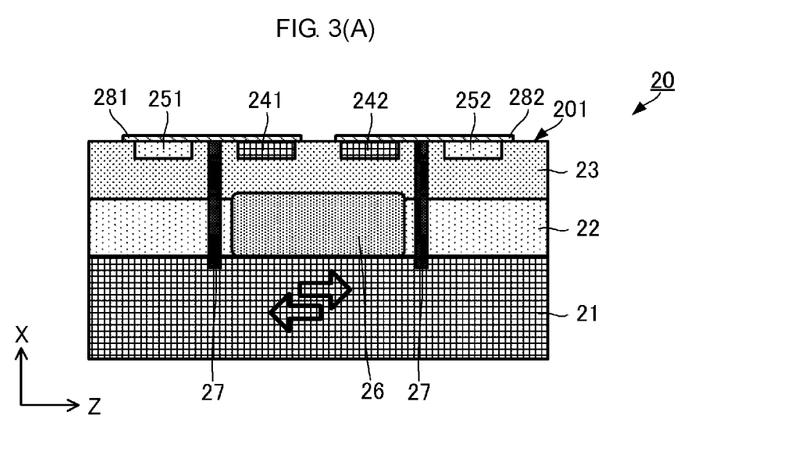
FIG. 3(A) is a sectional side view of the semiconductor substrate 20 according to the exemplary embodiment.
Figure 3B:
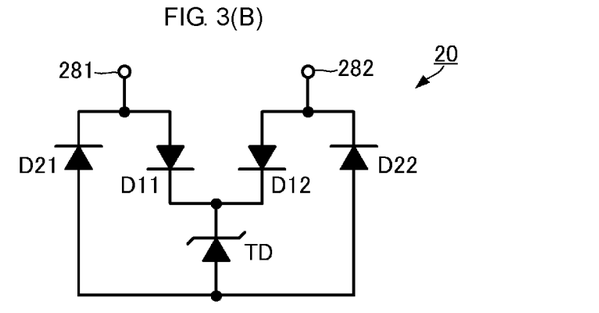
FIG. 3(B) is an equivalent circuit diagram of the semiconductor substrate 20 according to the exemplary embodiment.

An ESD protection device according to an exemplary embodiment of the present disclosure will be described with reference to the drawings. FIG. 1(A) is a perspective view of the appearance of an ESD protection device 10 according to the exemplary embodiment. FIG. 1(B) is the equivalent circuit diagram of the ESD protection device 10 according to the exemplary embodiment. FIG. 2(A) is a plan view of a mounting surface of the ESD protection device 10 according to the exemplary embodiment. FIG. 2(B) is a plan view of a main wiring surface of the ESD protection device 10 according to the exemplary embodiment. FIG. 2(C) is a plan view of a first main surface 201 of a semiconductor substrate 20 of the ESD protection device 10 according to the exemplary embodiment. FIG. 3(A) is a sectional side view of the semiconductor substrate 20 according to the exemplary embodiment. FIG. 3(A) illustrates a section along line A-A in FIG. 1(A). FIG. 3(B) is an equivalent circuit diagram of the semiconductor substrate 20 according to the exemplary embodiment. In the figures, the X-axis direction corresponds to a thickness direction. The Y-axis direction corresponds to a first direction. The Z-axis direction corresponds to a second direction.

As illustrated in FIG. 1(A), the ESD protection device 10 has a structure including the semiconductor substrate 20, a re-wiring layer 30, a terminal electrode 41, a terminal electrode 42, a terminal electrode 43, and a wiring electrode 51.

As illustrated in FIG. 1(B), the ESD protection device 10 has a circuit including a terminal P1, a terminal P2, a terminal P3, a main line 100, and a surge-absorbing element TVS. The terminal P1 and the terminal P2 are connected to each other by the main line 100. The main line 100 and the terminal P3 are connected to each other with the surge-absorbing element TVS interposed therebetween. With this structure, the terminal P1 and the terminal P2 are configured as input and output terminals for a target signal (a high-frequency signal, an analog signal, a digital signal, or a control signal). For example, the target signal that is inputted from the terminal P1 is outputted from the terminal P2 via the main line 100. The target signal that is inputted from the terminal P2 is outputted from the terminal P1 via the main line 100. The terminal P3 is grounded. A surge signal that is inputted from the terminal P1 or the terminal P2 is guided to the ground via the surge-absorbing element TVS and the terminal P3 (grounded).

(Schematic Structure of ESD Protection Device 10)

According to the exemplary embodiment, the semiconductor substrate 20 has a rectangular cuboid shaped. More specifically, the semiconductor substrate 20 has long sides that extend in the first direction perpendicular to the thickness direction and short sides that extend in the second direction perpendicular to the thickness direction and the first direction. The semiconductor substrate 20 has the first main surface 201 perpendicular to the thickness direction. The semiconductor substrate 20 contains the surge-absorbing element TVS described above.

The re-wiring layer 30 is formed on the first main surface 201 of the semiconductor substrate 20. The re-wiring layer 30 includes mainly an insulator, and various electrodes including the wiring electrode 51. The wiring electrode 51 forms a part of the main line 100 described above. Preferably, the side surfaces of the re-wiring layer 30 are flush with the corresponding side surfaces of the semiconductor substrate 20. The ESD protection device 10 that has such a structure has a rectangular cuboid shape.

One surface of the re-wiring layer 30 is in contact with the first main surface 201 of the semiconductor substrate 20, and the terminal electrode 41, the terminal electrode 42, and the terminal electrode 43 are formed on another surface of the re-wiring layer 30 opposite the one surface. In other words, the terminal electrode 41, the terminal electrode 42, and the terminal electrode 43 are disposed on the mounting surface of the ESD protection device 10. In an exemplary aspect, the terminal electrode 41, the terminal electrode 42, and the terminal electrode 43 are substantially rectangular in a plan view. However, it is noted that the shape of the terminal electrode 41, the terminal electrode 42, and the terminal electrode 43 is not limited to a substantially rectangular shape in a plan view and may be an eclipse shape, a polygonal shape, or another shape having a certain area.

As illustrated in FIG. 1(A) and FIG. 2(A), the terminal electrode 41 is formed near an edge of the mounting surface of the ESD protection device 10 in the first direction. The terminal electrode 42 is formed near another edge of the mounting surface of the ESD protection device 10 in the first direction. The terminal electrode 43 is formed at substantially the center of the mounting surface of the ESD protection device 10 in the first direction. That is, the terminal electrode 43 is formed on the mounting surface of the ESD protection device 10 between the terminal electrode 41 and the terminal electrode 42 in the first direction.

According to an exemplary aspect, the terminal electrode 41 corresponds to the terminal P1 of the circuit and corresponds to a "first terminal electrode" according to the present disclosure. Moreover, the terminal electrode 42 corresponds to the terminal P2 of the circuit and corresponds to a "second terminal electrode" according to the present disclosure. Further, the terminal electrode 43 corresponds to the terminal P3 of the circuit and corresponds to a "third terminal electrode" according to the present disclosure.

(Specific Structure of Semiconductor Substrate 20)

As illustrated in FIG. 3(A), the semiconductor substrate 20 has a Psub layer 21, a Nepi layer 22, and a Nepi layer 23. The Psub layer 21 is composed of a P-type semiconductor. The Nepi layer 22 and the Nepi layer 23 are composed of an N-type semiconductor. The Nepi layer 22 is formed on a surface of the Psub layer 21. The Nepi layer 23 is formed on a surface of the Nepi layer 22. That is, the Psub layer 21, the Nepi layer 22, and the Nepi layer 23 are stacked in this order in the thickness direction of the semiconductor substrate 20 (i.e., the vertical direction). A surface of the Nepi layer 23 corresponds to the first main surface 201 of the semiconductor substrate 20. Moreover, these layers correspond to a "third semiconductor region" according to the present disclosure.

A P-type region 241, a P-type region 242, an N-type region 251, and an N-type region 252 are formed in a surface region (region including the surface up to a certain depth) of the Nepi layer 23. In the P-type region 241 and the P-type region 242, P-type impurities are dominant. In the N-type region 251 and the N-type region 252, N-type impurities are dominant. The P-type region 241 and the N-type region 251 correspond to a "first semiconductor region" according to the present disclosure. The P-type region 242 and the N-type region 252 correspond to a "second semiconductor region" according to the present disclosure.

As illustrated in FIG. 2(C) and FIG. 3(A), the P-type region 241, the P-type region 242, the N-type region 251, and the N-type region 252 are arranged in the second direction of the semiconductor substrate 20. In this case, the N-type region 251, the P-type region 241, the P-type region 242, and the N-type region 252 are arranged in this order in the second direction. That is, the P-type region 241 and the P-type region 242 are disposed between the N-type region 251 and the N-type region 252 in the second direction, the N-type region 251 and the P-type region 241 are adjacent to each other, the P-type region 241 and the P-type region 242 are adjacent to each other, and the P-type region 242 and the N-type region 252 are adjacent to each other.

The P-type region 241, the P-type region 242, the N-type region 251, and the N-type region 252 are disposed at the center of the short sides of the semiconductor substrate 20 that extend in the second direction and the long sides thereof that extend in the first direction.

The semiconductor substrate 20 further includes an NBL (N-type embedded layer) 26. The NBL 26 extends across the Nepi layer 22 to the Nepi layer 23. The NBL 26 overlaps the P-type region 241 and the P-type region 242 in a plan view.

The semiconductor substrate 20 further includes a trench 27 as shown in FIG. 2(C), for example. Moreover, the trench 27 is composed of an insulator and has a rectangular frame shape in a plan view. As further illustrated in FIG. 3(A), the trench 27 extends through the Nepi layer 23 and the Nepi layer 22 from the surface of the Nepi layer 23 in the thickness direction and reaches a predetermined depth in the Psub layer 21. The trench 27 is formed such that the P-type region 241, the P-type region 242, and the NBL 26 are inside the frame, and the N-type region 251 and the N-type region 252 are outside the frame.

As illustrated in FIG. 2(C) and FIG. 3(A), a pad electrode 281 and a pad electrode 282 are formed on the surface of the Nepi layer 23, that is, the first main surface 201 of the semiconductor substrate 20. The pad electrode 281 and the pad electrode 282 are rectangular. The pad electrode 281 and the pad electrode 282 are spaced apart from each other in the second direction of the semiconductor substrate 20.

The pad electrode 281 overlaps the P-type region 241 and the N-type region 251 in a plan view. The pad electrode 282 overlaps the P-type region 242 and the N-type region 252 in a plan view. The pad electrode 281 corresponds to a "first pad electrode" according to the present disclosure. The pad electrode 282 corresponds to a "second pad electrode" according to the present disclosure.

With this structure, a circuit of the TVS illustrated in FIG. 3(B) is built in the semiconductor substrate 20. The pad electrode 281 is a terminal of the TVS. The pad electrode 282 is another terminal of the TVS.

The pad electrode 281 and the pad electrode 282 are connected to each other by a series circuit of a diode D11 and a diode D12. More specifically, the pad electrode 281 is connected to the anode of the diode D11, the cathode of the diode D11 is connected to the cathode of the diode D12, and the anode of the diode D12 is connected to the pad electrode 282. The P-type region 241 and the Nepi layer 23 serve as the diode D11 (see FIG. 3(A)). The P-type region 242 and the Nepi layer 23 serve as the diode D12 (see FIG. 3(A)).

The pad electrode 281 and the pad electrode 282 are connected to each other by a series circuit of the diode D21 and the diode D22. More specifically, the pad electrode 281 is connected to the cathode of the diode D21, the anode of the diode D21 is connected to the anode of the diode D22, and the cathode of the diode D22 is connected to the pad electrode 282. The N-type region 251, the Nepi layer 23, the Nepi layer 22, and the Psub layer 21 serve as the diode D21

(see FIG. 3(A)). The N-type region 252, the Nepi layer 23, the Nepi layer 22, and the Psub layer 21 serve as the diode D22 (see FIG. 3(A)).

A connection point between the diode D11 and the diode D12 is connected to a connection point between the diode D21 and the diode D22 with a zener diode TD interposed therebetween. More specifically, the connection point between the diode D11 and the diode D12 is connected to the cathode of the zener diode TD, and the anode of the zener diode TD is connected to the connection point between the diode D21 and the diode D22. The NBL 26 and the Psub layer 21 serve as the zener diode TD (see FIG. 3(A)).

With this structure, as illustrated by thick outline arrows in FIG. 3(A), a surge signal that is inputted from the pad electrode 281 or the pad electrode 282 travels in the Psub layer 21 that functions as a main propagation region in the second direction (direction parallel to the short sides of the semiconductor substrate 20). The length of the pad electrode 281 or the pad electrode 282 in the second direction is short. That is, a path along which the electric current of the surge signal flows is short because the surge signal travels as illustrated by dashed arrows in FIG. 1(A). Consequently, the ESL (equivalent series inductance) of the semiconductor substrate 20 with respect to the surge signal decreases. Accordingly, the use of the semiconductor substrate 20 enables the ESD protection device 10 to have a low ESL, inhibits ESD protection performance from being impaired, and inhibits the transmission characteristics of the target signal (desired signal) from being degraded.

According to the exemplary embodiment, the direction in which the electric current flows is perpendicular to the longitudinal direction (first direction) of the semiconductor substrate 20, and the sectional area of the current path practically increases. Consequently, the ESR (equivalent series resistance) of the semiconductor substrate 20 with respect to the surge signal decreases. Accordingly, the use of the semiconductor substrate 20 enables the ESD protection device 10 to have a low ESR and inhibits the ESD protection performance from being impaired.

(Specific Structure of Re-Wiring Layer 30)

The ESD protection device 10 has improved performance and characteristics because of the above structure of the semiconductor substrate 20 and the structure of the re-wiring layer 30 described below.

As illustrated in FIG. 1(A) and FIG. 2(B), the re-wiring layer 30 includes the wiring electrode 51 and an auxiliary wiring electrode 60. The wiring electrode 51 and the auxiliary wiring electrode 60 are disposed in the re-wiring layer 30 at positions in the thickness direction of the re-wiring layer 30.

As illustrated in FIG. 2(B), the wiring electrode 51 extends linearly in the first direction. The wiring electrode 51 includes a first end portion 511, a second end portion 512, a connection pad portion 513, a wiring portion 514, and a wiring portion 515. The first end portion 511, the wiring portion 514, the connection pad portion 513, the wiring portion 515, and the second end portion 512 are connected in this order in the first direction. The length of the first end portion 511, the second end portion 512, and the connection pad portion 513 in the second direction is longer than the length of the wiring portion 514 and the wiring portion 515 in the second direction.

The first end portion 511 overlaps the terminal electrode 41 in a plan view. The first end portion 511 is connected to the terminal electrode 41 with an interlayer connection electrode 601 interposed therebetween. The second end portion 512 overlaps the terminal electrode 42 in a plan view. The second end portion 512 is connected to the terminal electrode 42 with an interlayer connection electrode 602 interposed therebetween.

This structure enables the terminal P1 (terminal electrode 41) and the terminal P2 (terminal electrode 42) of the circuit illustrated in FIG. 1(B) to be connected to each other by the main line 100 (the wiring electrode 51, the interlayer connection electrode 601, and the interlayer connection electrode 602).

The connection pad portion 513 overlaps the pad electrode 281 on the first main surface 201 of the semiconductor substrate 20 in a plan view. The connection pad portion 513 is connected to the pad electrode 281 with an interlayer connection electrode 611 interposed therebetween.

The auxiliary wiring electrode 60 is rectangular in a plan view. The auxiliary wiring electrode 60 is spaced apart from the wiring electrode 51 in the second direction. More specifically, the auxiliary wiring electrode 60 and the connection pad portion 513 are arranged in the second direction.

The auxiliary wiring electrode 60 overlaps the pad electrode 282 on the first main surface 201 of the semiconductor substrate 20 in a plan view. The auxiliary wiring electrode 60 is connected to the pad electrode 282 with an interlayer connection electrode 612 interposed therebetween. The auxiliary wiring electrode 60 overlaps the terminal electrode 43 in a plan view. The auxiliary wiring electrode 60 is connected to the terminal electrode 43 with an interlayer connection electrode 603 interposed therebetween.

This structure enables the terminal P3 (terminal electrode 43) and the main line 100 (wiring electrode 51) of the circuit illustrated in FIG. 1(B) to be connected to each other with the TVS (semiconductor substrate 20) interposed therebetween.

With the structure of the re-wiring layer 30, the interlayer connection electrode 611 that extends linearly in the thickness direction connects the pad electrode 281 of the semiconductor substrate 20 and the wiring electrode 51 to each other. Accordingly, the length of the connection between the main line 100 and the TVS in FIG. 1(B) can be decreased. This decreases the ESL and ESR of the path along which the surge signal is transmitted to the TVS in the ESD protection device 10.

The pad electrode 282 of the semiconductor substrate 20 and the terminal electrode 43 are connected to each other by a substantially straight line in the thickness direction. Accordingly, the length of the connection between the TVS and the terminal P3 in FIG. 1(B) can be decreased. This decreases the ESL and ESR of the path along which the surge signal is transmitted from the TVS to a terminal for grounding in the ESD protection device 10.

With the structure of the re-wiring layer 30, the wiring electrode 51 extends linearly in the first direction in which the terminal electrode 41 and the terminal electrode 42 are arranged, and accordingly, the distance between the terminal electrode 41 and the terminal electrode 42 can be decreased. Accordingly, the length of the connection between the terminal P1 and the terminal P2 in FIG. 1(B), that is, the length of the main line 100 can be decreased. This reduces the transmission loss of the target signal.

According to the exemplary aspect, the interlayer connection electrode 601 is long in the second direction and has substantially the same shape as the first end portion 511 in a plan view. Similarly, the interlayer connection electrode 602 is long in the second direction and has substantially the same shape as the second end portion 512 in a plan view. This decreases the resistance of the interlayer connection electrode 601 and the interlayer connection electrode 602 and further reduces the transmission loss of the target signal.

Figure 4:
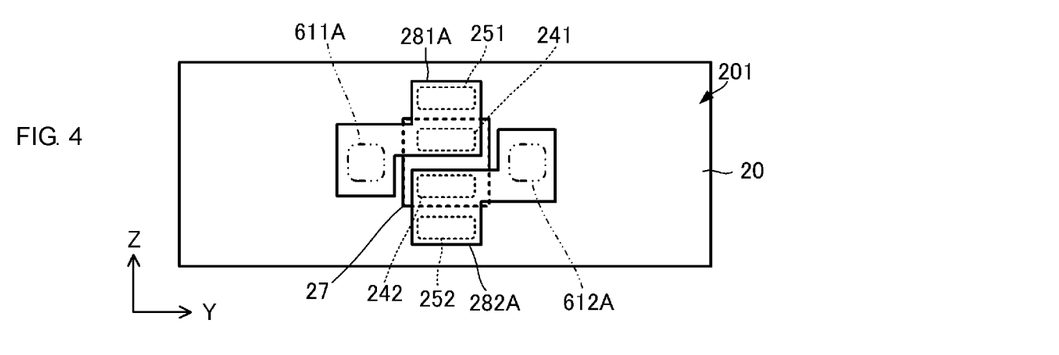
FIG. 4 is a plan view of pad electrodes 281A and 282A and interlayer connection electrodes 611A and 612A that are connected thereto and illustrates another arrangement thereof.

In the above description, the interlayer connection electrode 611 that is connected to the pad electrode 281 and the interlayer connection electrode 612 that is connected to the pad electrode 282 are arranged in the second direction. However, it should be appreciated that the arrangement of these interlayer connection conductors is not limited thereto. FIG. 4 is a plan view of pad electrodes 281A and 282A and interlayer connection electrodes 611A and 612A that are connected thereto and illustrates another arrangement thereof.

As illustrated in FIG. 4, the pad electrode 281A includes a main body, which can include a "first portion" according to the present disclosure, that overlaps the P-type region 241 and the N-type region 251 and a protruding portion that is connected to the main body and that projects in the first direction. The protruding portion of the pad electrode 281A projects toward the edge in the first direction. The pad electrode 282A includes a main body, which can include a "second portion" according to the present disclosure, that overlaps the P-type region 242 and the N-type region 252 and a protruding portion that is connected to the main body and that projects in the first direction. The protruding portion of the pad electrode 282A projects toward another edge in the first direction. In other words, the protruding portion of the pad electrode 281A and the protruding portion of the pad electrode 282A interpose the main body of the pad electrode 281A and the main body of the pad electrode 282A in the first direction. The interlayer connection electrode 611A overlaps the protruding portion of the pad electrode 281A. The interlayer connection electrode 611A is connected to a wiring electrode, not illustrated. The interlayer connection electrode 612A overlaps the protruding portion of the pad electrode 282A. The interlayer connection electrode 612A is connected to a terminal electrode for grounding with an auxiliary wiring electrode, not illustrated, interposed therebetween. Wiring lines to which the interlayer connection electrode 611A and the interlayer connection electrode 612A are connected can be appropriately determined.

Also, with this structure, the N-type region 251, the P-type region 241, the P-type region 242, and the N-type region 252 of the semiconductor substrate 20 are arranged in the second direction, and the surge signal travels in the Psub layer 21 of the semiconductor substrate 20 in the second direction. Accordingly, the same effects as with the above structure can be achieved. That is, the electrode pattern of the re-wiring layer 30 can be appropriately configured.

Figure 5A:
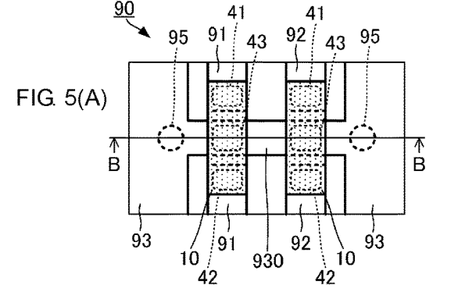
FIG. 5(A) is a plan view of a part of a signal transmission line 90 with the ESD protection devices 10 according to an exemplary embodiment.
Figure 5B:
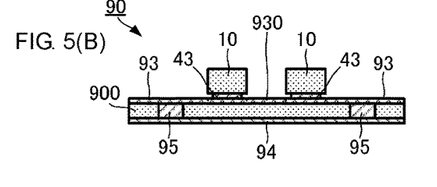
FIG. 5(B) is a sectional view of the signal transmission line 90 with the ESD protection devices 10 according to the exemplary embodiment.
Figure 5C:
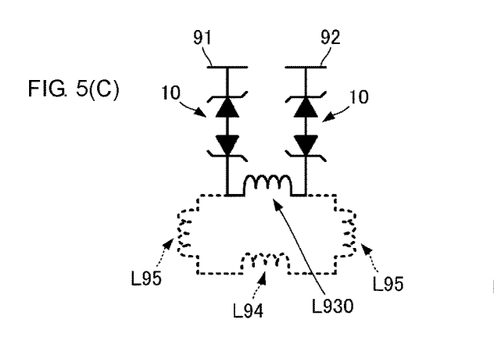
FIG. 5(C) is an equivalent circuit diagram of the signal transmission line 90 with the ESD protection devices 10 according to the exemplary embodiment when differential signals are transmitted.
Figure 5D:
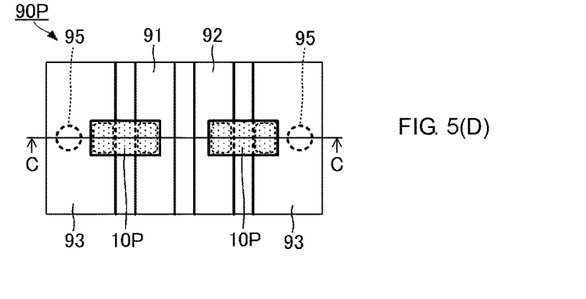
FIG. 5(D) is a plan view of a part of a signal transmission line 90P with two-terminal ESD protection devices 10P in a comparative example.
Figure 5E:
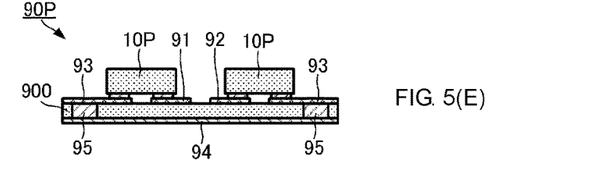
FIG. 5(E) is a sectional view of the signal transmission line 90P with the two-terminal ESD protection devices 10P in the comparative example.
Figure 5F:
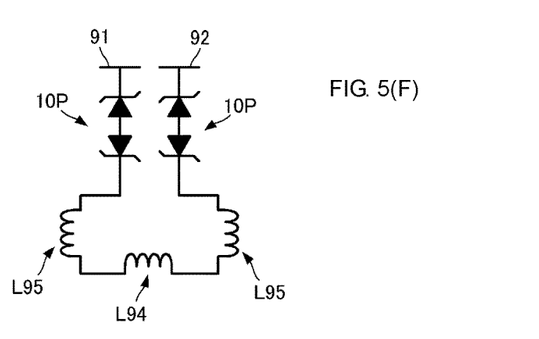
FIG. 5(F) is an equivalent circuit diagram of the signal transmission line 90P with the two-terminal ESD protection devices 10P in the comparative example when differential signals are transmitted.

The ESD protection device 10 that has the above structure is effectively used for a high-frequency signal transmission line 90 described below. FIG. 5(A) is a plan view of a part of the signal transmission line 90 with the ESD protection devices 10 according to the present invention. FIG. 5(B) is a sectional view of the signal transmission line 90 with the ESD protection devices 10 according to the present invention. FIG. 5(B) illustrates a section along line B-B in FIG. 5(A). FIG. 5(C) is an equivalent circuit diagram of the signal transmission line 90 with the ESD protection devices 10 according to the present invention when differential signals are transmitted. FIG. 5(D) is a plan view of a part of the signal transmission line 90P with two-terminal ESD protection devices 10P in a comparative example. FIG. 5(E) is a sectional view of the signal transmission line 90P with the two-terminal ESD protection devices 10P in the comparative example. FIG. 5(E) illustrates a section along line C-C in FIG. 5(D). FIG. 5(F) is an equivalent circuit diagram of the signal transmission line 90P with the two-terminal ESD protection devices 10P in the comparative example when differential signals are transmitted.

As illustrated in FIG. 5(A) and FIG. 5(B), the signal transmission line 90 includes an insulating substrate 900, the ESD protection devices 10, a line electrode 91, a line electrode 92, ground electrodes 93, a ground electrode 94 and an auxiliary ground electrode 930. The line electrode 91 corresponds to a "first line electrode" and the line electrode 92 corresponds to a "second line electrode" according to the present disclosure.

The line electrode 91, the line electrode 92, the ground electrodes 93 and the auxiliary ground electrode 930 are formed on a surface of the insulating substrate 900. The line electrode 91 and the line electrode 92 are parallel to each other. The ground electrodes 93 interpose the line electrode 91 and the line electrode 92 therebetween in the direction perpendicular to the direction in which the line electrode 91 and the line electrode 92 extend.

The line electrode 91 is divided into divided sections, and the line electrode 92 is divided into divided sections. The auxiliary ground electrode 930 is formed between the divided sections and connected to the ground electrodes 93 that interpose the line electrode 91 and the line electrode 92.

The ground electrode 94 is formed on a back surface of the insulating substrate 900. Interlayer connection electrodes 95 extend through the insulating substrate 900 in the thickness direction and connect the ground electrode 94 to the ground electrodes 93.

Moreover, in this aspect, the first ESD protection device 10 connects the divided sections of the line electrode 91 to each other. More specifically, the terminal electrode 41 of the first ESD protection device 10 is connected to an end of one of the divided sections of the line electrode 91, and the terminal electrode 42 of the first ESD protection device 10 is connected to an end of the other divided section of the line electrode 91. The terminal electrode 43 of the first ESD protection device 10 is connected to the auxiliary ground electrode 930. The first ESD protection device 10 corresponds to a "first ESD protection element" according to the present disclosure.

The second ESD protection device 10 connects the divided sections of the line electrode 92 to each other. More specifically, the terminal electrode 41 of the second ESD protection device 10 is connected to an end of one of the divided sections of the line electrode 92, and the terminal electrode 42 of the second ESD protection device 10 is connected to an end of the other divided section of the line electrode 92. The terminal electrode 43 of the second ESD protection device 10 is connected to the auxiliary ground electrode 930. The second ESD protection device 10 corresponds to a "second ESD protection element" according to the present disclosure.

With this structure, as illustrated in FIG. 5(C), the ground to the line electrode 91 and the ground to the line electrode 92 can be regarded as being connected to each other by practically only the auxiliary ground electrode 930 in the case where differential signals (signals having inverse phases) are transmitted to the line electrode 91 and the line electrode 92. Consequently, a parasitic inductance between lines that form a differential line is the sum of the inductance L930 of the auxiliary ground electrode 930 and the ESL of the ESD protection devices 10. The auxiliary ground electrode 930 is short, and the ESL of the ESD protection devices 10 is low as described above. Accordingly, the parasitic inductance between the lines that form the differential line can be decreased, ESD protection is achieved, and the bandpass characteristic of the signal transmission line 90 can be inhibited from being degraded.

As illustrated in FIG. 5(D) and FIG. 5(E), the signal transmission line 90P in the comparative example includes the insulating substrate 900, the two-terminal ESD protection devices 10P, the line electrode 91, the line electrode 92, the ground electrodes 93, and the ground electrode 94.

The line electrode 91, the line electrode 92, and the ground electrodes 93 are formed on a surface of the insulating substrate 900. The line electrode 91 and the line electrode 92 are parallel to each other. The ground electrodes 93 interpose the line electrode 91 and the line electrode 92 therebetween in the direction perpendicular to the direction in which the line electrode 91 and the line electrode 92 extend.

The ground electrode 94 is formed on a back surface of the insulating substrate 900. The interlayer connection electrodes 95 extend through the insulating substrate 900 in the thickness direction and connect the ground electrode 94 to the ground electrodes 93.

The first two-terminal ESD protection device 10P connects the line electrode 91 and the ground electrodes 93 to each other. More specifically, one of terminal electrodes of the first two-terminal ESD protection device 10P is connected to the line electrode 91, and the other terminal electrode is connected to the ground electrodes 93. A typical TVS composed of a semiconductor is connected between the one of the terminal electrodes and the other terminal electrode.

The second two-terminal ESD protection device 10P connects the line electrode 92 and the ground electrodes 93 to each other. More specifically, one of terminal electrodes of the second two-terminal ESD protection device 10P is connected to the line electrode 92, and the other terminal electrode is connected to the ground electrodes 93. A typical TVS composed of a semiconductor is connected between the one of the terminal electrodes and the other terminal electrode.

With this structure, as illustrated in FIG. 5(F), the ground to the line electrode 91 and the ground to the line electrode 92 can be regarded as being connected to each other by the ground electrodes 93, the interlayer connection electrodes 95, and the ground electrode 94 in the case where differential signals (signals having inverse phases) are transmitted to the line electrode 91 and the line electrode 92. Consequently, a parasitic inductance between lines that form a differential line is the sum of the inductance L95 of one of the interlayer connection electrodes 95, the inductance L94 of the ground electrode 94, the inductance L95 of the other interlayer connection electrode 95, and the ESL of the two-terminal ESD protection devices 10P. The inductance L95 of the interlayer connection electrodes 95 and the inductance L94 of the ground electrode 94 are large. The ESL of the two-terminal ESD protection devices 10P is larger than that of the ESD protection devices 10 according to the present invention. Accordingly, the parasitic inductance between the lines that form the differential line increases, and the two-terminal ESD protection devices 10P degrade the bandpass characteristic of the signal transmission line 90P.

Figure 6:
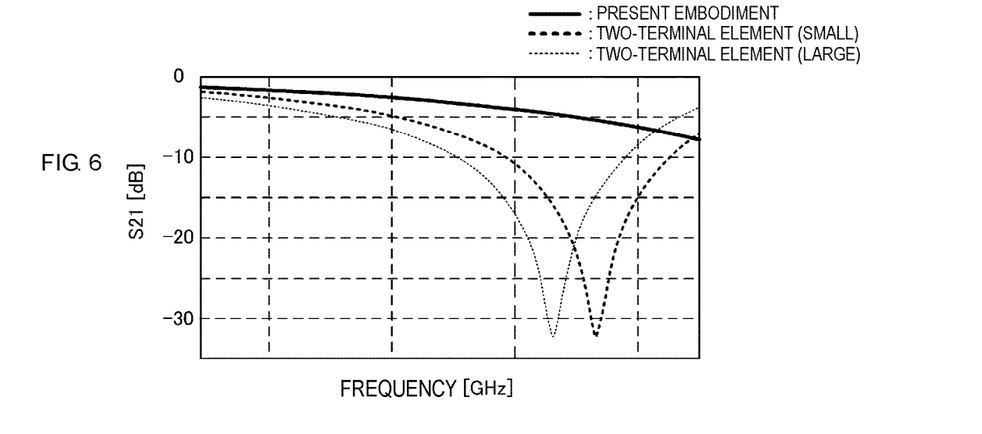
FIG. 6 is a graph illustrating S21 characteristics of the signal transmission line according to an exemplary embodiment and the signal transmission line in the comparative example with respect to differential signals.

FIG. 6 is a graph illustrating S21 characteristics of the signal transmission line 90 according to the present invention and the signal transmission line 90P in the comparative example with respect to the differential signals. In FIG. 6, the solid line represents the exemplary embodiment of the present disclosure as described above, and the dotted lines represent the comparative example. Moreover, the thick dashed line represents the case where the size of each two-terminal ESD protection device 10P is small (for example, an ESD protection device having 0402 size). The thin dashed line represents the case where the size of each two-terminal ESD protection device 10P is small (for example, an ESD protection device having 0603 size).

As illustrated in FIG. 6, the use of the signal transmission line 90 according to the present embodiment enables the differential signals to be transmitted with a loss lower than in the case of the comparative example while an ESD protection function is carried out.

With the structure according to the present embodiment, the parasitic inductance between line electrodes is affected by only the auxiliary ground electrode. Accordingly, changing the shape and design of the ground electrode does not lead to degradation of characteristics. That is, the degree of freedom of the design of the shape of the ground electrode is increased.

According to the embodiment described above, the ESD protection device is used for the high-frequency signal transmission line. However, the ESD protection device can be used for other circuits. For example, the ESD protection device can be used for a surge protection circuit of a LED power system and other surge protection circuits.

The positional relationship between the P-type semiconductor and the N-type semiconductor of the semiconductor substrate may be reversed. That is, a P-type semiconductor portion of the semiconductor substrate may be replaced with an N-type semiconductor portion, and an N-type semiconductor portion thereof may be replaced with a P-type semiconductor portion. The structure of the semiconductor substrate may be such that a P-type region and an N-type region are formed in a base semiconductor substrate so as to be separated from each other.

REFERENCE SIGNS LIST 10, 10P ESD protection device
20 semiconductor substrate
21 Psub layer
22 Nepi layer
23 Nepi layer
26 NBL
27 trench
30 re-wiring layer
41, 42, 43 terminal electrode
51 wiring electrode
60 auxiliary wiring electrode
90, 90P signal transmission line
91, 92 line electrode
93, 94 ground electrode
95 interlayer connection electrode
100 main line
201 first main surface
241, 242 P-type region
251, 252 N-type region
281, 281A, 282, 282A pad electrode
511 first end portion
512 second end portion
513 connection pad portion
514, 515 wiring portion
601, 602, 603, 611, 611A, 612, 612A interlayer connection electrode
900 insulating substrate
930 auxiliary ground electrode
D11, D12, D21, D22 diode L930, L94, L95 inductance
P1, P2, P3 terminal
TD zener diode
TVS surge-absorbing element

The invention claimed is:

1. An ESD protection device comprising:
a semiconductor substrate having a first main surface;
first and second terminal electrodes disposed on a mounting surface of the ESD protection device;
a third terminal electrode connected to a ground; and
a wiring electrode configured as a part of a main line and that electrically connects the first terminal electrode to the second terminal electrode,
wherein the semiconductor substrate has a rectangular cuboid shape in a plan view and has long sides that extend in a first direction perpendicular to a thickness direction of the semiconductor substrate and short sides that extend in a second direction perpendicular to the thickness direction and the first direction,
wherein the wiring electrode is connected to the third terminal electrode with the semiconductor substrate interposed therebetween,
wherein the semiconductor substrate has a first semiconductor region connected to the wiring electrode, a second semiconductor region connected to the third terminal electrode, and a third semiconductor region, and
wherein the first semiconductor region and the second semiconductor region are configured in the second direction and electrically connected to each other with the third semiconductor region extending in the second direction interposed therebetween.

2. The ESD protection device according to claim 1, wherein electric current flows from the wiring electrode to the third terminal electrode in the second direction of the semiconductor substrate in a plan view relative to the first main surface of the semiconductor substrate.

3. The ESD protection device according to claim 1, further comprising:
a first pad electrode disposed on the first main surface of the semiconductor substrate and connected to the wiring electrode; and
a second pad electrode disposed on the first main surface of the semiconductor substrate and connected to the third terminal electrode.

4. The ESD protection device according to claim 3, wherein the first pad electrode has a first portion configured such that electric current flows into the semiconductor substrate, and the second pad electrode has a second portion configured such that the electric current flows from semiconductor substrate.

5. The ESD protection device according to claim 4, wherein the first portion and the second portion are parallel to the second direction.

6. The ESD protection device according to claim 3, further comprising a re-wiring layer disposed on the first main surface and that contains the wiring electrode, the re-wiring layer including the mounting surface of the ESD protection device that is opposite the first main surface of the semiconductor substrate.

7. The ESD protection device according to claim 6, wherein the first, second and third terminal electrodes are outer electrodes that are exposed to an outside of the ESD protection device.

8. The ESD protection device according to claim 6, wherein the wiring electrode and the first pad electrode at least partly overlap in the plan view, and the third terminal electrode and the second pad electrode at least partly overlap in the plan view.

9. The ESD protection device according to claim 1, wherein the third terminal electrode is disposed between the first terminal electrode and the second terminal electrode in the first direction.

10. The ESD protection device according to claim 1, wherein the wiring electrode extends linearly in the first direction.

11. A signal transmission line comprising:
a first ESD protection element and a second ESD protection element that each have a structure of the ESD protection device according to claim 1;
first and second line electrodes; and
a ground electrode for grounding,
wherein the first line electrode is divided into a first plurality of divided sections in a transmission direction, with the first plurality of divided sections connected to each other by the first terminal electrode and the second terminal electrode of the first ESD protection element,
wherein the second line electrode is divided into a second plurality of divided sections in the transmission direction, with the second plurality of divided sections connected to each other by the first terminal electrode and the second terminal electrode of the second ESD protection element,
wherein an auxiliary ground electrode connected to the ground electrode is disposed between first and second line electrodes, and
wherein the third terminal electrode of the first ESD protection element and the third terminal electrode of the second ESD protection element are each connected to the auxiliary ground electrode.

12. An ESD protection device comprising:
a semiconductor substrate with a first main surface and having a rectangular cuboid shape with long sides that extend in a first direction perpendicular to a thickness direction of the semiconductor substrate and short sides that extend in a second direction perpendicular to the thickness direction and the first direction;
a re-wiring layer disposed on the first main surface and including a mounting surface opposite the first main surface of the semiconductor substrate;
first, second and third terminal electrodes disposed on the mounting surface; and
a wiring electrode disposed in the re-wiring layer and that electrically connects the first terminal electrode to the second terminal electrode and is further electrically connected to the third terminal electrode with the semiconductor substrate interposed therebetween,
wherein the semiconductor substrate has a first semiconductor region connected to the wiring electrode and extending in the second direction,
wherein the semiconductor substrate has a second semiconductor region connected to the third terminal electrode and extending in the second direction, and
wherein the semiconductor substrate has a third semiconductor region interposed between the first and second semiconductor regions.

13. The ESD protection device according to claim 12, wherein electric current flows from the wiring electrode to the third terminal electrode in the second direction of the semiconductor substrate in a plan view relative to the first main surface of the semiconductor substrate.

14. The ESD protection device according to claim 12, further comprising:

a first pad electrode disposed on the first main surface of the semiconductor substrate and connected to the wiring electrode; and a second pad electrode disposed on the first main surface of the semiconductor substrate and connected to the third terminal electrode.

15. The ESD protection device according to claim 14, wherein the first pad electrode has a first portion configured such that electric current flows into the semiconductor substrate, and the second pad electrode has a second portion configured such that the electric current flows from semiconductor substrate.

16. The ESD protection device according to claim 15, wherein the first portion and the second portion are parallel to the second direction.

17. The ESD protection device according to claim 12, wherein the first, second and third terminal electrodes are outer electrodes that are exposed to an outside of the ESD protection device.

18. The ESD protection device according to claim 14, wherein the wiring electrode and the first pad electrode at least partly overlap in a plan view, and the third terminal electrode and the second pad electrode at least partly overlap in the plan view.

19. The ESD protection device according to claim 12, wherein the third terminal electrode is disposed between the first terminal electrode and the second terminal electrode in the first direction.

20. The ESD protection device according to claim 12, wherein the wiring electrode extends linearly in the first direction.

* * * * *